United States Patent [19]

Taylor et al.

[11] Patent Number: 4,789,799
[45] Date of Patent: Dec. 6, 1988

[54] LIMITING CIRCUIT

[75] Inventors: Stewart S. Taylor, Beaverton; Bruce E. Miller, Portland, both of Oreg.

[73] Assignee: Tektronix, Inc., Beaverton, Oreg.

[21] Appl. No.: 745,387

[22] Filed: Jun. 17, 1985

Related U.S. Application Data

[63] Continuation of Ser. No. 482,120, Apr. 5, 1983, abandoned.

[51] Int. Cl.$^4$ ............................................... H03K 5/08
[52] U.S. Cl. ................................... 307/540; 307/555; 307/562
[58] Field of Search ............... 307/540, 553, 546, 547, 307/555, 562; 330/254, 301

[56] References Cited

U.S. PATENT DOCUMENTS 3,919,654  11/1975  Toumani .......................... 330/254
4,435,685   3/1984  Eckert et al. ..................... 330/252

Primary Examiner—John Zazworsky
Attorney, Agent, or Firm—John Smith-Hill; Francis I. Gray

[57] ABSTRACT

A limiter circuit comprises a first and second differential transistor amplifiers, with the collectors of the transistors of the second amplifier receiving the outputs of the first amplifier. A high gain amplifier has its inverting and non-inverting inputs connected to the output of the first differential amplifier, and has its output connected to the base of one of the transistors of the second amplifier through a feedback network. The differential amplifiers have respective current sources, the current sources of the second amplifier providing a larger current than that of the first amplifier.

4 Claims, 1 Drawing Sheet

LIMITING CIRCUIT

This is a continuation of application Ser. No. 482,120 filed Apr. 5, 1983 and now abandoned.

This invention relates to a limiting circuit, and particularly to a limiting circuit with high linearity and fast recovery.

BACKGROUND OF THE INVENTION

A limiting circuit is needed to restrict signal magnitude to a proper level when large changes of the input signal might have undesirable effects, i.e. saturation of circuit components, on an amplifier, an analog-to-digital converter (ADC), etc. which receives the signal. For example, a parallel-serial ADC might employ an interstage amplifier with a limiting operation. Assuming that a binary N bit analog-to-digital (A/D) conversion is performed by a typical two stage parallel-serial ADC, an input analog signal is applied to a first N/2 bit parallel ADC whose output is applied to a digital-to-analog converter (DAC) for reconstructing the input analog signal first quantized. The input signal may also be delayed by an amount equal to the delay due to the first N/2 bit parallel ADC and the DAC, and the reconstructed input signal is subtracted from the input signal by the interstage amplifier to produce an analog signal which is applied to the input of a second N/2 bit parallel ADC for providing an additional output digital signal which is combined with the output signal of the first N/2 bit ADC. It is desirable for the interstage amplifier to be a limiter circuit having differential inputs. Further, since such limiter circuit is used for A/D conversion, it is required to have high linearity and fast recovery.

FIG. 1 shows a prior art limiter circuit with differential inputs. This limiter circuit includes transistors 14 and 16 having their emitters coupled through resistors 18 and 20 having equal resistance values. An input voltage $V_{in}$ is applied between the bases of the transistors 14 and 16 through input terminals 10 and 12. Depending on use, the base of the transistor 16 may be grounded. A current source 22 is connected to the node of resistors 18 and 20 to flow common current 2I. Two current sources 24 and 26 each provide a current I to the collectors of the transistors from a positive voltage source +E. The output limit current is determined by the current I of the current sources 24, 26 and is derived from output terminals 28 and 30. The output current may be converted to voltage by a current-to-voltage converter, not shown.

When the input voltage $V_{in}$ is zero, the collector currents of the transistors 14 and 16 are both equal to I. When the input voltage $V_{in}$ increases, the collector current of the transistor 14 increases, while that of the transistor 16 decreases at the same rate. Assuming that the change in current is $\Delta I$, the collector currents of the transistors 14 and 16 are respectively $I+\Delta I$ and $I-\Delta I$. Since each current source provides a constant current, the current difference $\Delta I$ enters by way of the terminal 30 and leaves by way of the ouput terminal 28. When the input voltage $V_{in}$ increases still more, the current $\Delta I$ is limited to the value I. Thus, the maximum output current is determined by current sources 24 and 26 and is equal to I.

The collector current Ic, generally, is represented as follows:

$$Ic = Is \exp(qV/KT)$$

herein
q: charge of electron
T: absolute temperature
K: Boltzman Constant
Is: saturation current
V: voltage between the base and the emitter According to the above equation, Ic versus V curve is very nonlinear. Therefore, it will be understood that the output current has an S-shaped characteristic between the two limited levels as shown by a solid line in FIG. 2. Such a non-linear characteristic is undesirable for the input stage limit circuit of an ADC. However, this limiter circuit has a very fast recovery from an overload condition, i.e. a limited condition. In this respect, the FIG. 1 limiter circuit is suitable for an ADC.

SUMMARY OF THE INVENTION

According to the present invention there is provided a limiter circuit, comprising: a first differential transistor amplifier for providing output current limited between two predetermined levels; a second differential transistor amplifier having collectors for receiving the output of said first differential amplifier and having a transfer function similar to that of said first differential amplifier; and a high gain amplifier having inverting and non-inverting inputs for receiving the output of said first differential amplifier and an output connected to one base of said second differential amplifier through a feedback network.

The preferred embodiment of the invention includes a first input differential transistor pair with current limiting operation and an output active feedback amplifier having a second differential transistor pair and a high gain amplifier. The first and second differential transistor pairs have similar transfer functions, whereby the non-linearity of the first transistor pair is substantially cancelled by the second transistor pair. Further, the second transistor pair has a second current source flowing a current larger than that of a first current source of the first transistor pair. Therefore, the first transistor pair can be overdriven while the active feedback amplifier remains operational.

The preferred embodiment of the invention has high linearity and good overload recovery characteristics, and is thus suitable for use in an ADC.

In the preferred embodiment, the gain of the high gain amplifier was chosen to be 8, but any value up to about 100 may be used.

BRIEF DESCRIPTION OF THE DRAWINGS

For a better understanding of the invention, and to show how the same may be carried into effect, reference will now be made, by way of example, to the accompanying drawings in which:

In FIGS. 1 and 3, like reference numerals denote corresponding components.

DETAILED DESCRIPTION

Figure 1:
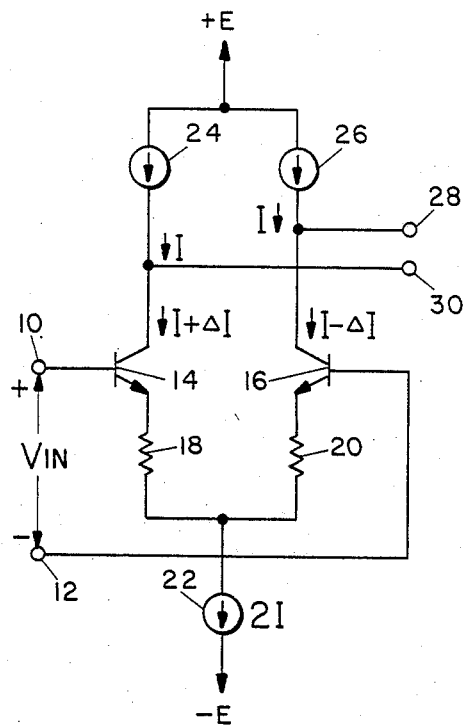
FIG. 1 is a circuit diagram of a prior art limiter circuit.
Figure 3:
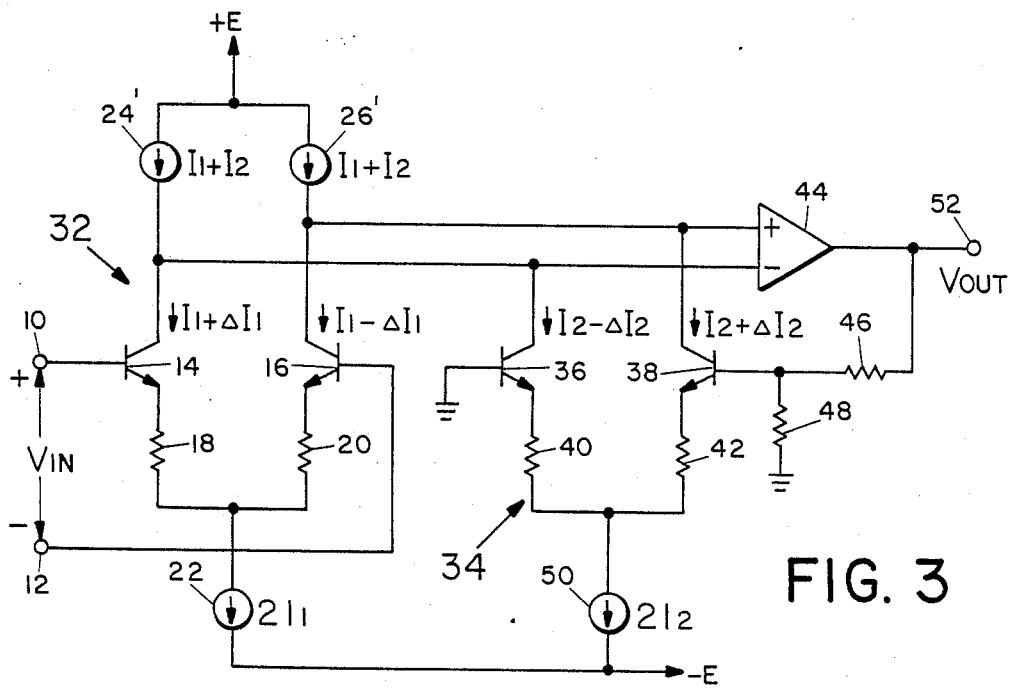
FIG. 3 is a circuit diagram of a limiter circuit embodying the present invention.

The limitter circuit shown in FIG. 3 includes as one sub-assembly a limiter circuit which is identical to that of FIG. 1, except that the current sources 24' and 26' each provide a constant current $I_1+I_2$ whereas the source 22 sinks a constant current $2I_1$. The additional current $I_2$ 1 is provided to a second stage comprising transistors 36 and 38. The resistance values of the resistors 18 and 20 is $R_1$. The collectors of the transistors 14 and 16 respectively connected to the collectors of the transistors 36 and 38 having their emitters coupled to each other through resistors 40 and 42, and are also respectively connected to an inverting input and a non-inverting input of an amplifier 44 having very large gain. The resistors 40 and 42 are of equal resistance value, say $R_2$. The transistors 36 and 38 are equal to transistors 14 and 16 in electrical characteristic. It is desirable that all of the transistors are formed in a single chip in order to keep them at the same thermal condition. The base of the transistor 36 is grounded, whereas the base of the transistor 38 is connected to the output of the amplifier 44 through a resistor 46 and is also grounded through a resistor 48. Preferably, if the gain of the amplifier 44 is greater than two, the resistance value of the resistor 46 is larger than that of the resistor 48. A current source 50 is connected between the node of the resistors 40 and 42 and the negative voltage source $-E$ to provide a constant current $2I_2$. It should be noted that the current $I_2$ is larger than current $I_1$. Transistors 36 and 38, their associated components and the amplifier 44 form an active feedback amplifier. The gain of such active feedback amplifier depends on the resistance values $R_1$ and $R_2$, resistance values of the resistors 46 and 48, and the magnitudes of the currents $I_1$ and $I_2$. An output voltage is derived from output terminal 52.

Figure 2:
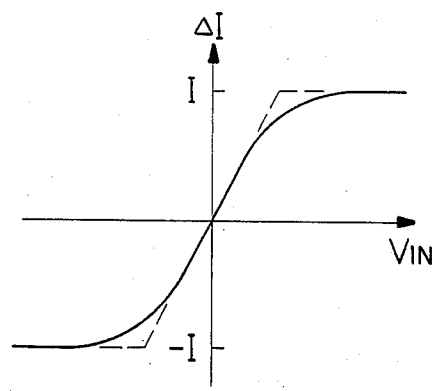
FIG. 2 is a graph for showing an output of the prior art limiter circuit.

In operation, the differential amplifier 32 formed by the transistors 14 and 16 provides the output current $\Delta I_1$ in response to the input voltage $V_{in}$, as described with reference to FIG. 1. The high gain amplifier 44 and the differential amplifier 34 formed by the transistors 36 and 38 convert the output current $\Delta I_1$ into a voltage $V_{out}$ by feedback. Establishing the resistance values of the resistors 46 and 48 respectively to $(G-1)R$ and $R$, the feedback network transfer function is $1/G$. The feedback voltage $V_{out}/G$ increases the collector current of transistor 38 to sink the output current $\Delta I_1$. Accordingly, nearly all of the output current $\Delta I_1$ from the differential amplifier 32 flows into the collector of the transistor 38 as a current change $\Delta I_2$. On the other hand, current $\Delta I_2$ is diverted from the collector of the transistor 36 into the collector of the transistor 14. Since the gain of the amplifier 44 is large, the gain constant of the active feedback amplifier will be the inverse of the feedback network transfer function. This will be the gain constant G times the inverse of the non-linear transfer function of the differential amplifier 34. The transfer function of the differential amplifier 32 is nearly the same as that of differential amplifier 34. The directions of current change in the transistors 14 and 36 are opposite, and also those of the transistors 16 and 38 are opposite. Consequently, non-linearities in transistors 14 and 16 are approximately canceled by those of transistors 36 and 38. Therefore, the transfer function $A_v(=V_{out}/V_{in})$ will be very nearly linear, as shown by the broken line in FIG. 2, and nearly equal to the gain constant G.

The maximum value of $V_{out}$ under limiting condition, i.e. the output limiting voltage, is $$V_{out}|_{max} = G\left[2I_1 R_2 + V_T \ln \frac{1 + I_1/I_2}{1 - I_1/I_2}\right]$$

where $V_T = kT/q$.

It can be shown that the nonlinearity of the FIG. 3 circuit is reduced compared to a simple differential pair, and that there is a null in the circuit for minimum nonlinearity. The designer can make compromises among nonlinearity, component values and output limiting voltage according to his needs.

Since the collector currents of the transistors 14 and 16 change within $+I_1$, the collector currents of the transistors 36 and 38 change by the same amount. If the amount of the current drawn by the source 50 is equal to or less than that drawn by the source 22, the feedback loop will be opened when $\Delta I_1 = I_2$, causing $V_{out}$ to limit at a value determined by other circuit elements. With uncontrolled limiting, the recovery time of the entire circuit will be undesirably long.

The key to obtaining a fast recovery time with the configuration of FIG. 3 is to choose the appropriate ratio between current sources 22 and 50. The values of resistors 18, 20 and 40, 42 are chosen in conjunction with $I_1$ and $I_2$ to obtain the desired value of limiting ($V_{out/max}$) and linearity. If the current $I_2$ is chosen larger than $I_1$, the feedback loop formed by the differential transistors 36 and 38 and the high gain amplifier 44 remains operational in a closed feedback loop when the differential transistors 14 and 16 are overdriven. Therefore, the recovery time for the entire circuit is primarily that of differential amplifier transistors 14 and 16, which is very fast.

While an embodiment of the present invention has been shown and described, it will be apparent to those skilled in the art that change and modification may be made without departing from the scope of the invention as defined in the appended claims, and equivalents thereof. For instance, the differential transistors may have their emitters connected to each other with a single resistor and individually connected to similar current sources.

We claim:
1. A limiter circuit, comprising:
   a first differential transistor amplifier having two output terminals and providing at said output terminals an output current limited between two predetermined levels, said first differential amplifier having a first current source for providing a constant current;
   a second differential transistor amplifier having collectors for receiving the output current of said first differential amplifier, said second differential amplifier having a transfer function similar to that of said first differential amplifier and having a second current source for providing a constant current larger then that of the first current source; and a high gain amplifier having inverting and non-inverting input terminals connected respectively to the output terminals of said first differential amplifier and also having an output terminal connected to the base of one of the transistors of said second differential amplifier through a feedback network consisting of a first resistive element connected between the output terminal of the high gain amplifier and the base of said one transistor of the second differential amplifier and a second resistive element connected between the base of said one transistor and a reference potential level.

2. A limiter circuit comprising:

a first differential transistor amplifier having two output terminals for providing at said output terminals an output current limited between two predetermined levels, said first differential amplifier having first and second current sources providing constant, equal currents and connected to the two output terminals respectively and also having a third current source for providing a constant current that is smaller than the current provided by each of the first and second constant current sources, a second differential transistor amplifier having collectors for receiving the output current of said first differential amplifier, said second differential amplifier having a transfer function similar to that of said first differential amplifier and having a current source for providing a constant current equal to the difference between the sum of the currents provided by the first and second current sources and the current provided by the third current source, and a high gain amplifier having inverting and non-inverting input terminals connected respectively to the output terminals of said first differential amplifier and also having an output terminal connected to the base of one of the transistors of said second differential amplifier through a feedback network.

3. A limiter circuit according to claim 2, wherein said feedback network is a resistive divider including said resistive circuit element.

4. A limiter circuit according to claim 2, wherein the feedback network consists of at least one resistive circuit element and no reactive circuit elements.

* * * * *